United States Patent
Noguchi et al.

[11] Patent Number: 5,183,780
[45] Date of Patent: Feb. 2, 1993

[54] METHOD OF FABRICATING SEMICONDUCTOR DEVICE

[75] Inventors: Shigeru Noguchi; Satoshi Ishida; Hiroshi Iwata; Keiichi Sano; Shoichiro Nakayama, all of Osaka, Japan

[73] Assignee: Sanyo Electric Co., Ltd., Osaka, Japan

[21] Appl. No.: 658,389

[22] Filed: Feb. 20, 1991

[30] Foreign Application Priority Data

Feb. 22, 1990 [JP] Japan ................................. 2-42135

[51] Int. Cl.$^5$ .................. H01L 21/26; H01L 21/306
[52] U.S. Cl. .................. 437/173; 437/186; 437/195
[58] Field of Search .............. 437/173, 174, 934, 936, 437/247, 141, 159, 134, 155, 186; 250/492.2, 492.3

[56] References Cited

U.S. PATENT DOCUMENTS

| | | | |
|---|---|---|---|
| 4,234,356 | 11/1980 | Auston et al. | 437/936 |
| 4,400,715 | 8/1983 | Barbee et al. | 357/55 |
| 4,542,580 | 9/1985 | Delivorias | 437/29 |
| 4,651,410 | 3/1987 | Feygenson | 437/173 |

FOREIGN PATENT DOCUMENTS

| | | | |
|---|---|---|---|
| 61-163635 | 7/1986 | Japan | 437/173 |
| 1093822 | 12/1967 | United Kingdom | 437/173 |

OTHER PUBLICATIONS

Optoelectronics Devices and Technologies, vol. 1, No. 2, pp. 235-248, Dec. 1989, entitled "The Transformation of a-Si:H Into Polycrystalline Silicon by Excimer Laser Irradiation and its Application to TFTs".
IBM Technical Disclosure, vol. 11, No. 2, Jul. 1968, Joshi et al. "Inducing Impurity Myration in Semiconductors by lasers."

*Primary Examiner*—Olik Chaudhuri
*Assistant Examiner*—Loc Q. Trinh
*Attorney, Agent, or Firm*—Darby & Darby

[57] ABSTRACT

In a method of fabricating a semiconductor device according to the present invention, a semiconductor film is formed on a substrate, and an insulator film is formed so as to cover the semiconductor film. Then, a dopant source is arranged on the insulator film and then, a region for electrical contact is irradiated with a high-energy beam through the dopant source. Consequently, the insulator film and the semiconductor film in the irradiated region are melted, to form a polycrystalline contact region having impurities supplied from the dopant source doped therein. Thus, the high-energy beam is irradiated to the region for electrical contact through the dopant source to form the polycrystalline contact region, thereby to make it possible to omit the patterning process such as etching processing for providing a contact hole.

34 Claims, 7 Drawing Sheets

METHOD OF FABRICATING SEMICONDUCTOR DEVICE

BACKGROUND OF THE INVENTION

1. Field of the Invention

The present invention relates to a method of fabricating a semiconductor device such as a thin film transistor.

2. Description of the Prior Art

A thin film transistor (hereinafter referred to as TFT) using amorphous, polycrystalline, microcrystalline semiconductors or a semiconductor obtained by mixing these semiconductors in place of a conventional single crystal semiconductor has been developed. The semiconductor materials listed as above are hereinafter collectively referred to as non-single crystal.

Of the non-single crystal semiconductors, an amorphous semiconductor material, particularly amorphous silicon (abbreviated as a-Si hereinafter) is frequently used when TFTs are formed in large quantities on a substrate having a large area from the advantages that its characteristics of semiconductor as a transistor are stable and a-Si having a large area can be formed.

In recent years, TFTs made of a-Si have been employed as transistors of an active matrix type liquid crystal display device.

Such a TFT also utilizes the advantages that a semiconductor film having a large area can be easily formed by the plasma CVD (chemical vapor deposition) method and at the same time, a silicon nitride ($SiN_x$) film and an silicon oxide ($SiO_2$) film to be a gate insulator film or a passivation film which constitutes the TFT can be continuously formed by only changing source gases in the same method.

A method of fabricating the above described TFT will be briefly described with reference to FIGS. 5A to 5H.

FIGS. 5A to 5H are cross sectional views showing the sequential steps of a method of fabricating an inverted staggered type TFT.

First, as shown in FIG. 5A, a thin metal film made of chromium (Cr), titanium (Ti) or the like is formed on an insulating transparent substrate 1 made of glass or the like, and this thin film is patterned using photoresist, to form a gate electrode 2.

Subsequently, as shown in FIG. 5B, a gate insulator film 3 made of $SiO_2$, $SiN_x$ or the like, a semiconductor film 4 made of a-Si, and a passivation film 5 made of $SiO_2$ or the like are sequentially deposited using the plasma CVD method or the like.

Then, as shown in FIG. 5C, the passivation film 5 is patterned by etching, leaving the above passivation film 5 only in a channel portion on the gate electrode 2.

Then, an $n^+$-type a-Si film 6 is deposited on the entire surface of the semiconductor film 4 including the passivation film 5 as an impurity doped semiconductor film having phosphorus (P) doped in large quantities into a-Si so as to make ohmic contact as shown in FIG. 5D and then, this deposited thin film is patterned, to form island regions 7 as shown in FIG. 5E.

Then, a metal film 8 made of aluminum (Al) or the like is formed on the $n^+$-type a-Si film 6 as shown in FIG. 5F, and then, the metal film 8 is etched, to form a source electrode 9 and a drain electrode 10 as shown in FIG. 5G.

Finally, as shown in FIG. 5H, the $n^+$-type a-Si film 6 on the passivation film 5 is etched away, thereby to form an inverted staggered type TFT.

In the above described fabricating method, the following four photoresist processes are required: the photoresist process for forming a gate electrode, the photoresist process for leaving a passivation film on a channel, the photoresist process for forming island regions and the photoresist process for forming source and drain electrodes. Accordingly, it is inevitable that the fabricating processes are complicated.

Furthermore, in the above described conventional fabricating method, the $n^+$-type a-Si film 6 is removed by plasma etching with the photoresist used in forming the source and drain electrodes 9 and 10 being left.

However, there are some problems. For example, the resist is cured by this plasma etching, to make it difficult to remove the resist from the surfaces of the electrodes 9 and 10, contributing to decreased yield.

Additionally, if the $n^+$-type a-Si film 6 is removed by plasma etching after removing the above described photoresist, there arise some difficulties this time. For example, a carbon polymer is produced on the surfaces of the electrodes 9 and 10.

Moreover, an article entitled "THE TRANSFORMATION OF a-Si: H INTO POLYCRYSTALLINE SILICON BY EXCIMER LASER IRRADIATION AND ITS APPLICATION TO TFTs", OPTOELECTRONICS Devices and Technologies, Vol. 1, No. 2, pp. 235 and 248, December, 1989 discloses the technique for turning a-Si into polycrystalline silicon (abbreviated as poly-Si hereinafter) by a laser beam and doping impurities into source and drain regions. This conventional technique, however, has the disadvantage of requiring the patterning process for leaving an impurity doped semiconductor layer having impurities previously doped in large quantities only in a portion where impurities are to be doped.

SUMMARY OF THE INVENTION

The present invention has been made in view of the above described conventional problems and has for its object to provide a method of fabricating a semiconductor device in which the fabricating processes are simplified and yield is improved.

The method of fabricating a semiconductor device according to the present invention is characterized by forming a semiconductor film on a substrate, forming an insulator film so as to cover the above semiconductor film, providing a dopant source on the above insulator film and then, irradiating at least a region for electrical contact with a high-energy beam through the above dopant source to melt the above insulator film and the above semiconductor film in this irradiated region whereby a polycrystalline contact region having dopant supplied from the above dopant source is made in the above irradiated region.

According to the present invention, the high-energy beam is irradiated to the region for electrical contact through the dopant source, to melt the insulator film and the semiconductor film. Accordingly, dopant supplied from the dopant source are doped into the semiconductor film, to form the polycrystalline contact region. Consequently, it is possible to omit the patterning process such as etching processing for providing a contact hole.

When the present invention is applied to the fabrication of a thin film capacitor used as part of a semiconductor device, a silicon (Si) substrate having an insulator layer formed on its surface, an electrode film made of poly-Si, SiO$_2$, BCl$_3$, and a laser, for example, are respectively used as the above substrate, the above semiconductor film, the above insulator film, the above dopant source, and the above high-energy beam.

Furthermore, when the present invention is applied to the fabrication of an inverted staggered type TFT in which electrodes are provided beneath the above semiconductor film while being separated by an insulator film, an insulating transparent substrate made of glass, quartz or the like, a-Si material, a passivation film made of SiO$_2$ or SiN$_x$, an impurity doped semiconductor film having phosphorus (P) doped in large quantities into an a-Si film, and an argon laser, for example, are respectively used as the above substrate, the above semiconductor film, the above insulator film, the above dopant source, and the above high-energy beam. The thickness of the above insulator film is made smaller than that of the above semiconductor film, preferably 50 to 1000 Å.

In this case, a contact region having a larger thickness than that of the impurity doped semiconductor film is formed by irradiating high-energy beams to the impurity doped semiconductor film having impurities for electrical contact doped therein, thereby to make it possible to simply remove the unnecessary impurity doped semiconductor film with the contact region being left by etching the entire surface of the thin film. Accordingly, the photoresist processes can be omitted to simplify the fabricating processes and no resist is required. Consequently, resist normally used in removing an impurity doped region is not used and thus improves yield.

Furthermore, when the present invention is applied to a coplanar type TFT in which electrodes are provided on the above semiconductor film while being separated by the above insulator film, an insulating transparent substrate made of glass, quartz or the like, poly-Si, an insulator film made of SiO$_2$ or SiN$_x$, an impurity doped semiconductor film having phosphorus (P) doped in large quantities into an a-Si film, and an argon laser, for example, are respectively used as the above substrate, the above semiconductor film, the above insulator film, the above dopant source, and the above high-energy beam.

Also in this case, a contact region having a larger thickness than that of the impurity doped semiconductor film is formed by irradiating high-energy beams to the impurity doped semiconductor film having impurities for electrical contact doped therein, thereby to make it possible to simply remove the unnecessary impurity doped semiconductor film with the contact region being left by etching the entire surface of the thin film. Accordingly, the photoresist processes can be omitted to simplify the fabricating processes and no resist is required. Consequently, resist normally used in removing an impurity doped region is not used and thus improves yield.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring now to FIGS. 1 to 3, description is made of embodiments of the present invention.

A first embodiment of the present invention will be described with reference to FIGS. 1A to 1D. FIGS. 1A to 1D are cross sectional views showing the sequential steps of a method of fabricating a thin film capacitor used as part of a semiconductor device.

Figure 1A:
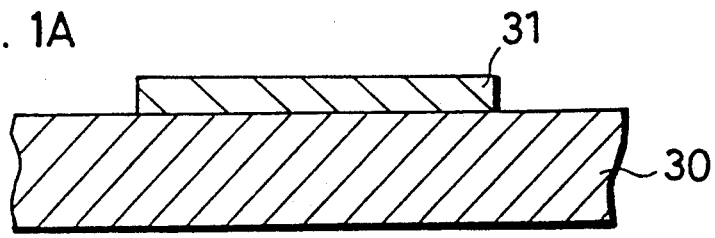
FIGS. 1A to 1D are cross sectional views showing the sequential steps of a method of fabricating a first embodiment of the present invention.

First, as shown in FIG. 1A, an electrode film 31 made of p-type poly-Si having electrical conductivity of $10^{-1} \Omega^{-1} cm^{-1}$ or more is formed by the low pressure CVD method or the like on a Si substrate 30 having an insulating layer formed on its surface.

Figure 1B:
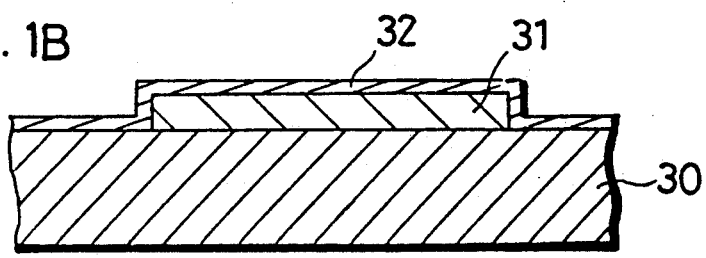

Then, as shown in FIG. 1B, an insulator film 32 made of SiO$_2$ is formed so as to cover the electrode film 31 by thermal oxidation or the like. The thickness of the insulator film 32 is smaller than that of the electrode film 31, i.e., approximately 50 to 500 Å.

Figure 1C:
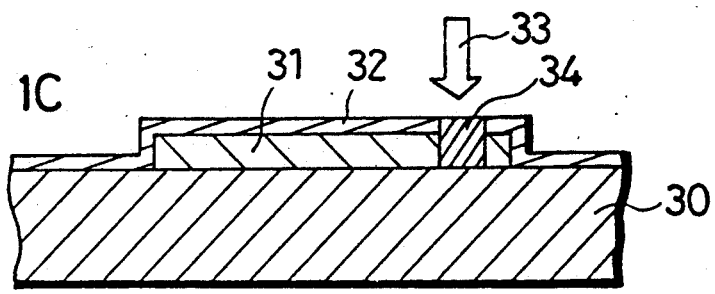

Then, as shown in FIG. 1C, a high-energy beam 33 is irradiated to a position to be one electrode region from the side of the insulator film 32 in an atmosphere of gases composed of at least B(CH$_3$)$_3$, Al(CH$_3$)$_3$, BCl$_3$, B$_2$H$_6$ or the like. If this high-energy beam is irradiated, the insulator film 32 made of SiO$_2$ absorbs part of the beam but almost all of the beam transmits through the insulator film 32 to the electrode film 31. Much of the beam is absorbed by the electrode film 31 made of p-type poly-Si located beneath the insulator film 32 and melts the electrode film 31. On the other hand, the above described insulator film 32 is also melted by heat produced by such melting. The dopant gas is adsorbed on the surface of the melting insulator film 32 and is decomposed by heat, to form boron (B). Consequently, the above described boron is diffused into the poly-Si of the electrode film 31 and the film is doped.

Furthermore, when the dopant gas has the property of absorbing the above described beam, the gas is photolyzed, diffused into poly-Si which is doped.

An ArF laser, an XeF laser or the like having a power of 500 mJ/cm$^2$ is used as the above described high-energy beam 33. The above described laser beam is irradiated by 1 to 20 pulses in an atmosphere of BCl$_3$ at 50 Torr.

Figure 1D:
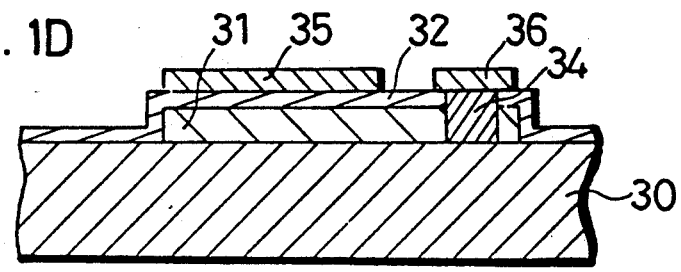

Thereafter, as shown in FIG. 1D, a metal film made of aluminum (Al), chromium (Cr), molybdenum (Mo) or the like is formed by the evaporation method, the sputtering method or the like and then, this metal film is patterned by etching to form a first electrode 35 and a second electrode 36, thereby to obtain a thin film capacitor.

In the above described embodiment, description was made of a case where the contact region 34 made of B-doped p-type poly-Si is formed in the electrode film 31 made of p-type poly-Si. When a contact region 34 made of n+-type poly-Si is to be formed in an electrode film 31 made of n-type poly-Si, however, PCl$_3$ or AsH$_3$ may be used as a dopant gas.

A second embodiment of the present invention will be described with reference to FIGS. 2A to 2D. FIGS. 2A to 2D are cross sectional views showing the sequential steps of a method of fabricating a thin film capacitor used as part of a semiconductor device.

Figure 2A:
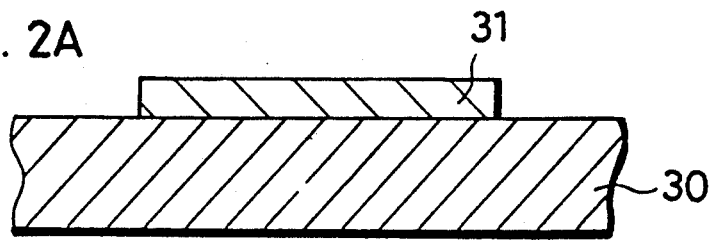
FIGS. 2A to 2D are cross sectional views showing the sequential steps of a second embodiment of the present invention.

First, as shown in FIG. 2A, an electrode film 31 made of p-type poly-Si having electrical conductivity of $10^{-1} \Omega^{-1} cm^{-1}$ or more is formed by the low pressure CVD method or the like on a Si substrate 30 having an insulator layer formed on its surface.

Figure 2B:
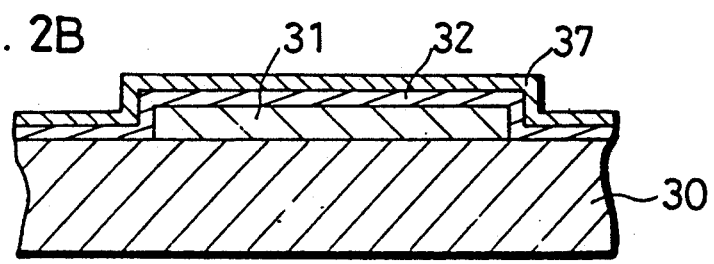

Then, as shown in FIG. 2B, an insulator film 32 made of SiO$_2$ is formed so as to cover the electrode film 31 by thermal oxidation or the like. The thickness of the insulator film 32 is smaller than that of the electrode film 31, i.e., approximately 50 to 500 Å. An impurity doped semiconductor film (p+-type poly-Si film) 37, 500 Å thick, having boron (B) doped in large quantities into poly-Si as impurities is formed on the insulator film 32 by the low pressure CVD method or the like.

Figure 2C:
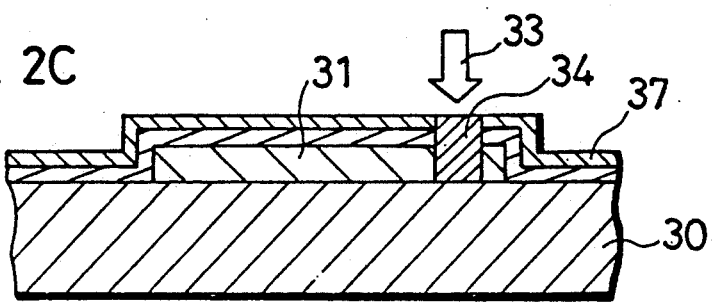

Then, as shown in FIG. 2C, a high-energy beam 33 is irradiated to a position to be one electrode region from the side of the p+-type poly-Si film 37. An argon laser (having a wavelength of 5145 Å) having a power of 5 to 20 W, having a beam diameter of 2 to 100 μm and having a scanning speed of 5 to 20 cm/sec., for example, is used as the high-energy beam 33.

Therefore, when the high-energy beam 33 is irradiated from above the p+-type poly-Si film 37, the p+-type poly-Si film 37 is melted. In addition, the high-energy beam 33 passes through the insulator film 32 so that the electrode film 31 located beneath the insulator film 32 is also melted. Consequently, the insulator film 32 is also melted by heat from above and below. B included as dopant in the p+-type poly-Si film 37 is diffused into the electrode film 31, to from a contact region 34 made of B-doped p-type poly-Si.

Figure 2D:
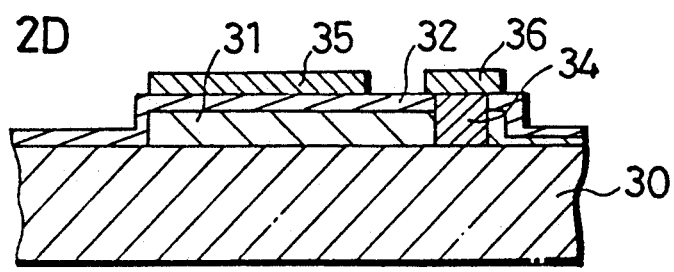

Thereafter, as shown in FIG. 2D, after the entire upper surface of the thin film is etched to remove the p+-type poly-Si film 37, a metal film made of Al, Cr, Mo or the like is formed by the evaporation method, the sputtering method or the like and then, this metal film is patterned by etching to from a first electrode 35 and a second electrode 36, thereby to obtain a thin film capacitor.

In the above described embodiment, description was made of a case where the contact region 34 made of B-doped p-type poly-Si is formed in the electrode film 31 made of p-type poly-Si. When a contact region 34 made of n+-type poly-Si is to be formed in an electrode film 31 made of n-type poly-Si, however, an n+-type poly-Si film having phosphorus (P) doped in large quantities into poly-Si as impurities, for example, may be used as an impurity doped semiconductor film.

As described in the foregoing, according to the first and second embodiments, the contact hole and the contact region are simultaneously formed using the high-energy beam. Accordingly, the photoresist processes can be omitted as compared with the conventional example. In order to obtain a large capacity capacitor, it is necessary to make the insulator film 32 thinner. If the insulator film 32 is made thin, it becomes easy to melt the insulator film 32 by the high-energy beam, which is suitable for the fabrication of a large capacity thin film capacitor.

A third embodiment of the present invention will be described with reference to FIGS. 3A to 3G. FIGS. 3A to 3G are cross sectional views showing the sequential steps of a method of fabricating an inverted staggered type TFT.

Figure 3A:
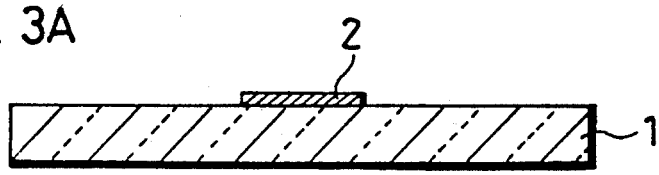
FIGS. 3A to 3G are cross sectional views showing the sequential steps of a third embodiment of the present invention.

First, as shown in FIG. 3A, a thin metal film made of chromium (Cr), titanium (Ti), tungsten (W), molybdenum (Mo), tantalum (Ta) or the like is formed on an insulating transparent substrate 1 made of glass, quartz or the like by the vacuum evaporation method or the like, and this thin film is patterned to form a gate electrode 2.

Figure 3B:
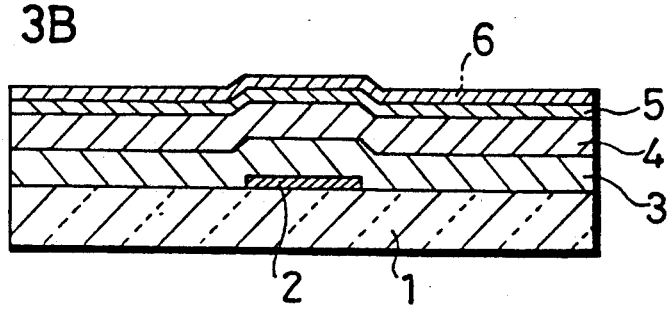

Subsequently, as shown in FIG. 3B, a gate insulator film 3 made of SiO$_2$, SiN$_x$ or the like, a semiconductor film 4, 2000 Å thick, made of a-Si, a passivation film 5 made of SiO$_2$, SiN$_x$ or the like, and an impurity doped semiconductor film (n+-type a-Si film) 6, 500 Å thick, having phosphorus (P) doped in large quantities into an a-Si film as impurities are sequentially deposited by the plasma CVD method, the low pressure CVD method or the like. At this time, the thickness of the passivation film 5 cannot be made too large because the passivation film 5 must be melted in the process as described later. On the other hand, if the thickness thereof is too small, the passivation film 5 does not perform its inherent function. Accordingly, control is so carried out that the thickness of the passivation film 5 becomes 50 to 1000 Å.

Figure 3C:
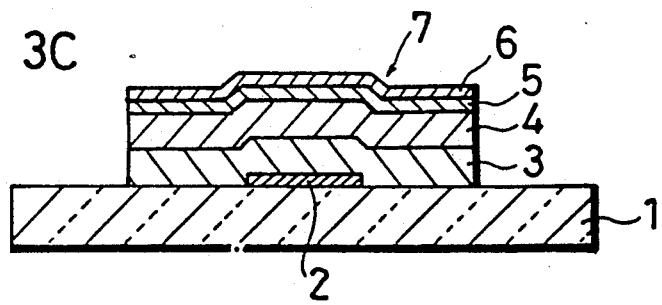

Then, as shown in FIG. 3C, this deposited thin film is so patterned that the thin film exists on both sides of the semiconductor film 4 constituting a channel region, to from island regions 7.

Figure 3D:
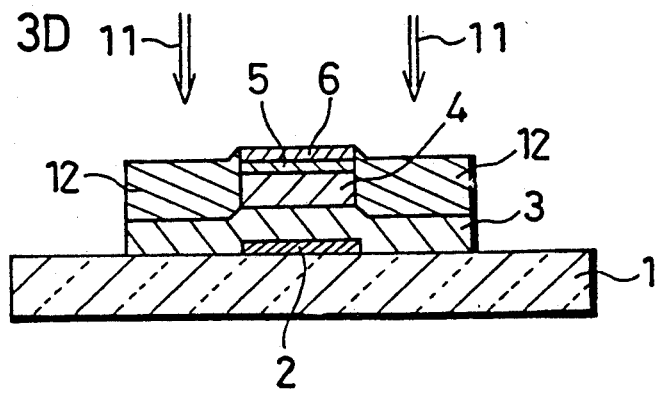

Thereafter, as shown in FIG. 3D, high-energy beams 11 are irradiated to positions to be source and drain regions from the side of the n+-type a-Si film 6. An argon laser (having a wavelength of 5145 Å) having a power of 5 to 20 W, having a beam diameter of 2 to 100 μm and having a scanning speed of 5 to 20 cm/sec., for example, is used as the high-energy beam 11.

Therefore, when the high-energy beams 11 are irradiated from above the n+-type a-Si film 6, the n+-type a-Si film 6 is melted. In addition, the high-energy beams 11 pass through the passivation film 5 so that semiconductor film 4 located beneath the passivation film 5 is also melted. Consequently, the passivation film 5 is also melted from heat above and below. P included as dopant in the n+-type a-Si film 6 is diffused into the semiconductor film 4, and this melted region is slowly cooled, to form a contact region 12 made of n-type poly-Si. At this time, the conductivity σd of the contact region 12 becomes $10^{-3} \Omega^{-1} cm^{-1}$ or more.

On the other hand, no high-energy beam is irradiated to the gate electrode 2, that is, the passivation film 5 on the channel region. Accordingly, the passivation film 5 remains in only this portion.

Figure 3E:
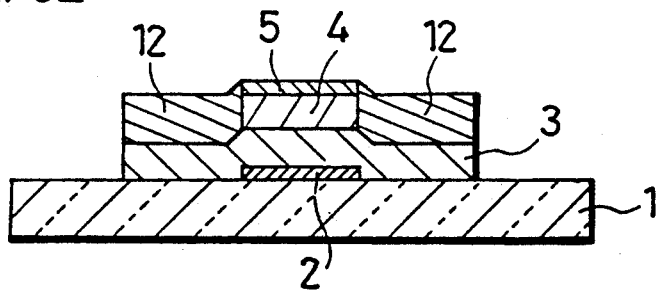

Thereafter, as shown in FIG. 3E, the entire upper surface of the thin film is etched, to remove the n+-type a-Si film 6. This etching is, for example, dry etching using a CF$_4$ gas. When this CF$_4$ gas is used, the n+-type a-Si film 6 is etched away earlier than the contact region 12 made of n-type poly-Si even if the entire upper surface of the thin film is etched because the etching rate of a-Si is larger than that of poly-Si. Moreover, even if the n+-type a-Si film 6 is completely removed, the contact region 12 remains because the thickness of the contact region 12 is larger than that of the n+-type a-Si region 6.

Figure 3F:
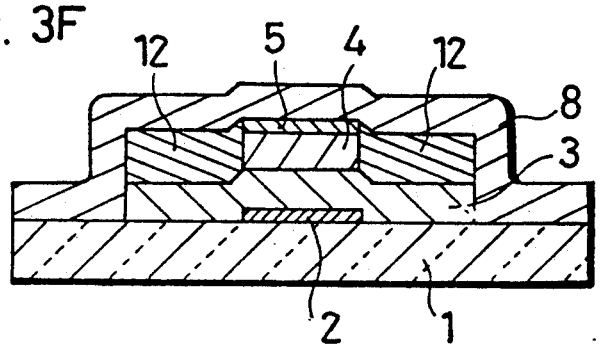
Figure 3G:
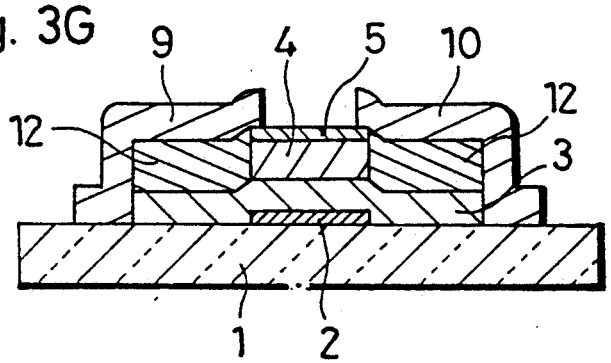

Thereafter, a metal film 8 made of Al or the like is formed by the evaporation method or the like as shown in FIG. 3F and then, the metal film 8 is patterned by etching to form a source electrode 9 and a drain electrode 10 as shown in FIG. 3G, thereby to obtain an inverted staggered type TFT.

According to the third embodiment, the process of patterning the passivation film 5 and the process of forming the contact region simultaneously take place using the high-energy beams. Accordingly, the photoresist processes can be omitted as compared with the conventional example. Furthermore, the unnecessary n+-type a-Si film 6 is removed without requiring resist conventionally used and without the presence of conventionally existent metal for electrodes. Consequently, the possibilities of, for example, curing resist and forming a polymer on metal electrodes are entirely eliminated, to improve yield.

Although in the third embodiment, a-Si is used for the semiconductor film 4 and the n+-type a-Si film 6, poly-Si may be used to form the semiconductor film 4 and the impurity doped semiconductor film having impurities for electrical contact doped therein.

In this case, both the contact region 12 and the impurity doped semiconductor film after irradiation of the high-energy beam are made of poly-Si, so that their etching rates are the same. As described above, however, the thickness of the contact region is larger than that of the impurity doped semiconductor film. Accordingly, even if the unnecessary impurity doped semiconductor film is removed by surface etching, the contact region 12 remains in a predetermined position.

A fourth embodiment of the present invention will be described with reference to FIGS. 4A to 4G. FIGS. 4A to 4G are cross sectional views showing the sequential steps of a method of fabricating a coplanar type TFT.

Figure 4A:
FIGS. 4A to 4G are cross sectional views showing the sequential steps of a forth embodiment of the present invention.
Figure 4B:
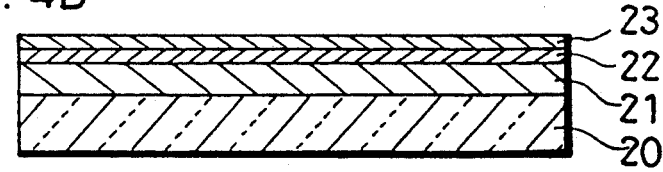

First, as shown in FIG. 4A, an insulating transparent substrate 20 made of glass, quartz or the like is prepared. Then, as shown in FIG. 4B, a semiconductor film 21 made of poly-Si, a gate insulator film 22 made of SiO$_2$, SiN$_x$ or the like, and an impurity doped semiconductor film 23 made of a-Si or poly-Si having phosphorus (P) doped therein in large quantities as impurities so as to make ohmic contact are sequentially deposited on the substrate 20 by the low pressure CVD method or the like. At this time, the thickness of the semiconductor film 21 is approximately 2000 Å, the thickness of the gate insulator film 22 is approximately 1000 Å, and the thickness of the impurity doped semiconductor film 23 is approximately 500 Å.

Figure 4C:
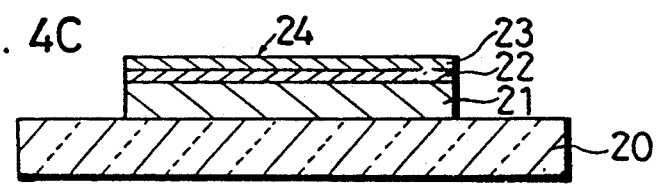

Then, as shwon in FIG. 4C, this deposited thin film is so patterned that the thin film is left on both sides of the semiconductor film 21 constituting a channel region, to form island regions 24.

Figure 4D:
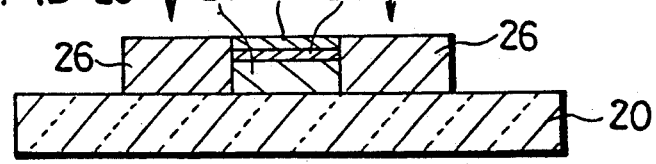

Then, as shown in FIG. 4D, high-energy beams 25 are irradiated to positions to be source and drain regions with the channel region being interposed therebetween from the side of the impurity doped semiconductor film 23, as in the first embodiment.

Therefore, when the high-energy beams 25 are irradiated from above the impurity doped semiconductor film 23, the impurity doped semiconductor film 23 is melted and the gate insulator film 22 is also melted. Accordingly, P in the impurity doped semiconductor film 23 is diffused into the semiconductor film 21, to form a contact region 26 made of n-type poly-Si, as in the second embodiment. At this time, the conductivity $\sigma$d of the contact region 26 becomes $10^{-3}$ $\Omega^{-1}$ cm$^{-1}$ or more. Since no high-energy beam is irradiated to the gate insulator film 22 to be the channel region, the gate insulator film 22 remains in only this portion.

Figure 4E:
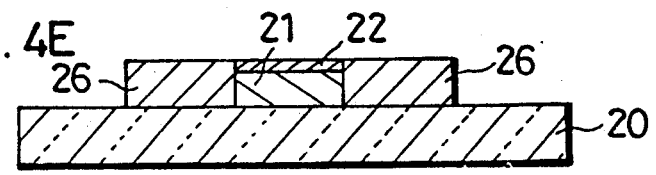

Thereafter, as shown in FIG. 4E, the entire surface of the thin film is etched using a CF$_4$ gas, to remove the impurity doped semiconductor film 23. As described above, when a-Si is used for the impurity doped semiconductor film 23, the impurity doped semiconductor film 23 is etched earlier than the contact region 26, leaving the contact region 26 even if the entire surface of the thin film is etched because the etching rate of a-Si is higher than that of poly-Si of the contact region 26. Furthermore, as described above, even if poly-Si is used for the impurity doped semiconductor film 23, the impurity doped semiconductor film 23 can be also removed, leaving the contact region 26 by etching the entire surface of the thin film.

Figure 4F:
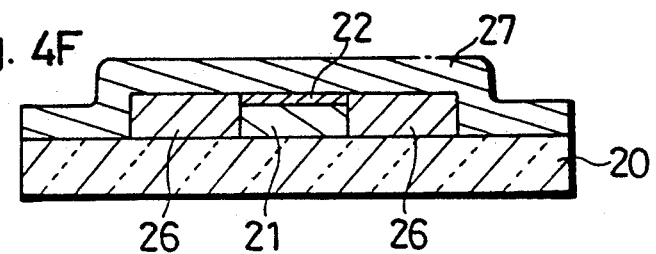
Figure 4G:
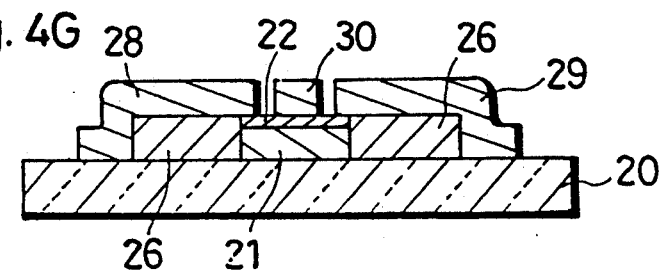
Figure 5A:
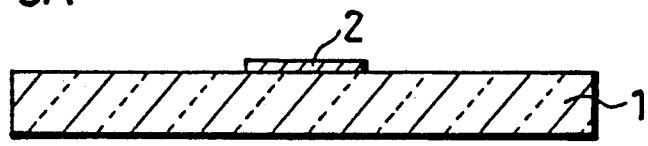
FIGS. 5A to 5H are cross sectional views showing the sequential steps of a conventional method of fabricating a thin film transistor.
Figure 5B:
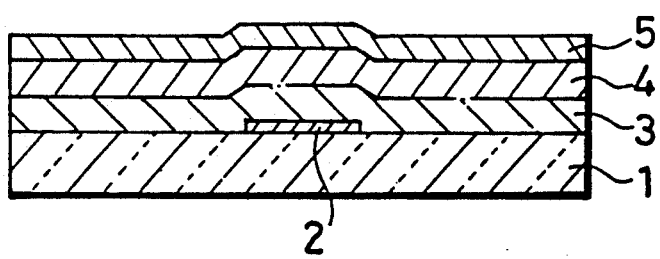
Figure 5C:
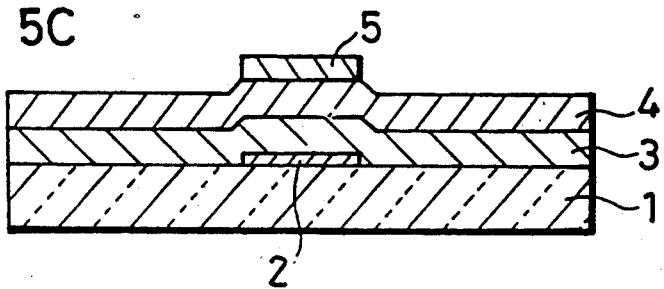
Figure 5D:
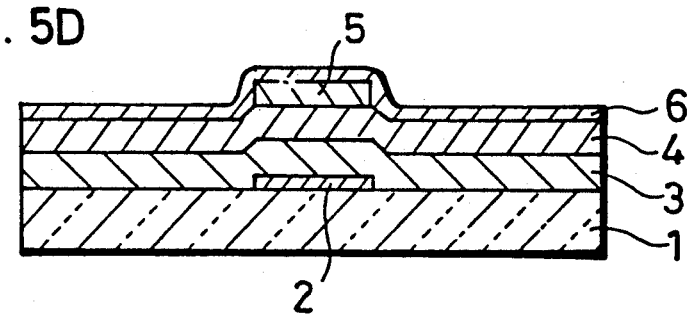
Figure 5E:
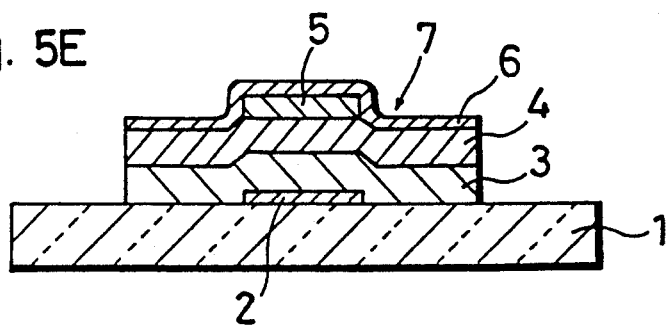
Figure 5F:
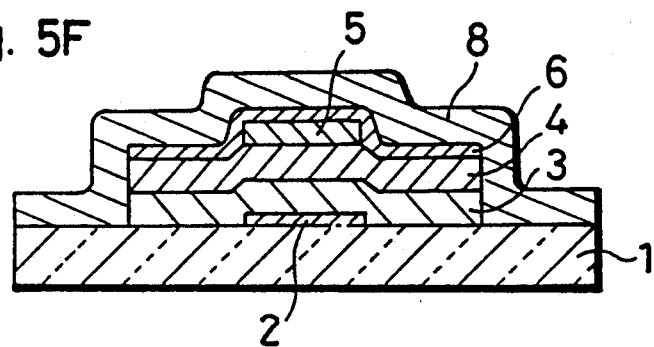
Figure 5G:
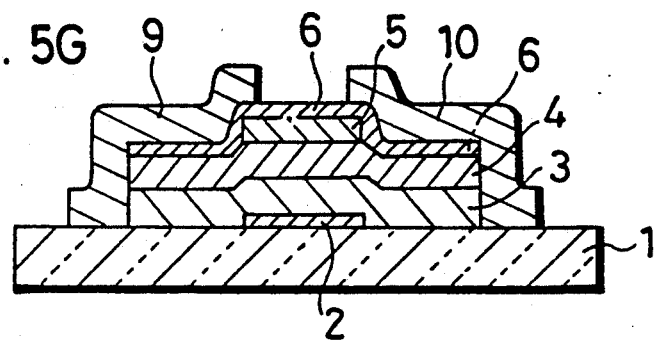
Figure 5H:
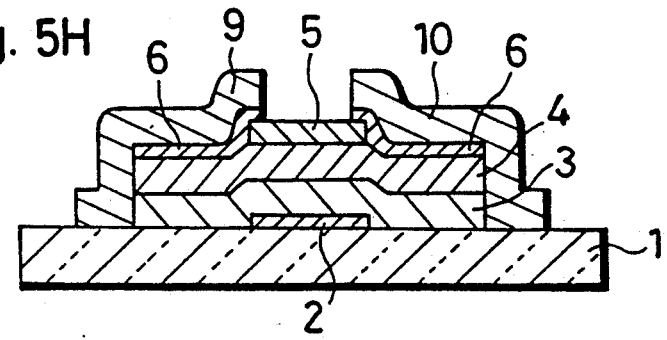

Thereafter, a metal film 27 made of Al or the like is formed by the evaporation deposition method or the like as shown in FIG. 4F and then, the metal film 27 is patterned by etching to form a source electrode 28, a drain electrode 29 and a gate electrode 30 as shown in FIG. 4G, thereby to obtain a coplanar type TFT.

According to the fourth embodiment, the photoresist process of providing a gate insulator film with a contact hole so as to form a contact region is not required, thereby to simplify the fabricating processes.

Although in the above described third and fourth embodiments, the high-energy beams are irradiated from above, that is, the side of the impurity doped semiconductor film, they can be irradiated from the side of the transparent electrode by suitably selecting the wavelength of a laser or the like.

Furthermore, although in the above described third and fourth embodiments, description was made of an n-channel type TFT, a p-channel type TFT can be similarly formed by reversing the conductivity type of impurities.

Additionally, although in the above described third and fourth embodiments, the impurity doped semiconductor film is used as a dopant source, a dopant gas may be used, as in the first embodiment. Also in this case, a TFT can be similarly fabricated.

Moreover, if a single crystal insulating substrate made of high-resistance silicon, sapphire or the like, spinel or the like is used as a substrate, a single crystal silicon may be used as a semiconductor film. Also in this case, it goes without saying that the same effect is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device, comprising the steps of:
   forming a semiconductor film on a substrate,
   forming an insulator film so as to cover said semiconductor film;
   providing a dopant source;
   irradiating at least a region of said device with a high-energy beam passing through said dopant source to melt both said insulator film and said semiconductor film in the irradiated region to form in said irradiated region a polycrystalline electrical contact region having dopant supplied from said dopant source.

2. The method according to claim 1, wherein the semiconductor device is a thin film capacitor.

3. The method according to claim 1, wherein the thickness of said insulator film is smaller than that of said semiconductor film and the thickness of said insulator film is in the range from about 50 to 1000 Å.

4. The method according claim 1, wherein said dopant source comprises at least one gas containing a predetermined dopant.

5. The method according to claim 1, wherein said substrate is a silicon substrate having an insulator layer formed on its surface, said semiconductor film is an electrode film made of polycrystalline silicon, said insulator film is $SiO_2$, and said high-energy beam is a laser.

6. The method according to claim 4, wherein said semiconductor film is an electrode film made of p-type polycrystalline silicon, said dopant gas is boron chloride selected from the group of gases consisting of $B(CH_3)$, $Al(CH_3)$, $BCl_3$ and $B_2H_6$, and said high-energy beam is an XeF laser.

7. The method according to claim 1, wherein said dopant source is a doped semiconductor film.

8. A method of fabricating a semiconductor device, comprising the steps of:
forming a semiconductor film on a substrate;
forming an insulator film to cover said semiconductor film;
providing on said insulator film an impurity doped semiconductor film having impurities for determining electrical conductivity doped therein; and
irradiating a region of the device with a high-energy beam through said impurity doped semiconductor film, to melt all of said insulator film, said semiconductor film, and said impurity doped semiconductor film in the irradiated region to form a polycrystalline contact region having impurities supplied from the impurity doped semiconductor film doped therein.

9. The method according to claim 8, wherein said substrate is a silicon substrate having an insulator layer formed on its surface, said semiconductor film is an electrode film made of polycrystalline silicon, said insulator film is $SiO_2$, said impurity doped semiconductor film is of the p-type or n-type polycrystalline silicon, and said high-energy beam is a laser.

10. The method according to claim 8, wherein the said thickness of said insulator film is smaller than that of said semiconductor film and the thickness of said insulator film is in the range from about 50 to 1000 Å.

11. The method according to claim 8, wherein the thickness of said insulator film is smaller than that of said semiconductor film and thickness of said insulator film is in the range from about 50 to 1000 Å.

12. A method of fabricating a semiconductor device, comprising the steps of:
forming a semiconductor film on a substrate;
forming an insulator film containing no dopant impurities to cover said semiconductor film;
providing on said insulator film an impurity doped semiconductor film having impurities for determining electrical conductivity doped therein; and
irradiating a region of said device with a high-energy beam through said impurity doped semiconductor film, to melt all of said insulator film, said semiconductor film, and said impurity doped semiconductor film in the irradiated region to form a polycrystalline contact region having impurities supplied from the impurity doped semiconductor film doped therein.

13. The method according to claim 12, wherein said substrate is a silicon substrate having an insulator layer formed on its surface, said semiconductor film is an electrode film made of polycrystalline silicon, said insulator film is $SiO_2$ containing no dopant impurities, said impurity doped semiconductor film is a semiconductor film of polycrystalline silicon, and said high-energy beam is a laser.

14. The method of fabricating a semiconductor device, comprising the steps of:
forming a gate electrode on an insulating substrate;
forming in order on the gate electrode a gate insulator film, a semiconductor film, and an insulator film;
providing a dopant source for said insulator film;
irradiating a region of the device with a high-energy beam through said dopant source to melt both said insulator film, and said semiconductor film in the irradiated region to form a polycrystalline electrical contact region having impurities supplied from the dopant source doped therein.

15. The method according to claim 14, wherein said insulator film is an insulator film containing no impurities serving as dopant.

16. The method according to claim 14, wherein said dopant is at least one gas containing the desired dopant.

17. The method according to claim 14, wherein said substrate is an insulating transparent substrate, and said semiconductor film is a semiconductor selected from a group consisting of amorphous silicon, polycrystalline silicon, and microcrystalline silicon.

18. The method according to claim 14, wherein said insulator film is a passivation film of $SiO_2$ and/or $SiN_x$ containing no impurities serving as dopant, and said high-energy beam is a laser.

19. The method according to claim 14, wherein the said thickness of said insulator film is smaller than that of sid semiconductor film and thickness of said insulator film is in the range from about 50 to 1000 Å.

20. A method of fabricating a semiconductor device, comprising the steps of;
forming a gate electrode on an insulating substrate;
forming on the gate electrode a gate insulator film, a semiconductor film, and an insulator film in this order;
providing on said insulator film an impurity doped semiconductor film having large numbers of impurities for determining electrical conductivity doped therein;
irradiating a region of the device with a high-energy beam through said impurity doped semiconductor film, to melt all of said insulator film, said semiconductor film, and said impurity doped semiconductor film in the irradiated region, to form a polycrystalline electrical contact region having impurities supplied from the impurity doped semiconductor film doped therein.

21. The method according to claim 20, wherein said substrate is an insulating transparent substrate, said semiconductor film is amorphous silicon, said insulator film is a passivation film made of $SiO_2$ and/or $SiN_x$ containing no impurities serving as dopant, and said high-energy beam is a laser.

22. The method according to claim 20, wherein the said thickness of said insulator film is smaller than that of said semiconductor film and thickness of said insulator film is in the range from about 50 to 1000 Å.

23. The method according to claim 20, wherein the thickness of said semiconductor film is 2000 Å, and the thickness of said insulator film is in the range from about 50 to 1000 Å.

24. A method of fabricating a semiconductor device, comprising the steps of:
forming a semiconductor film on a substrate;
providing an insulator film to cover said semiconductor film;
proving a dopant source from said insulator film;
irradiating a region of said device with a high-energy beam through said dopant source to melt said insulator film and said semiconductor film in the irradiated region to form a polycrystalline electrical contact region having impurities supplied from said dopant source doped therein, and
providing source and drain electrodes on said polycrystalline contact region, respectively, and providing a gate electrode on said insulator film.

25. The method according to claim 24 wherein said insulator film is an insulator film containing no impurities serving as dopant.

26. The method according to claim 24, wherein said dopant is at least one gas containing a predetermined dopant.

27. The method according to claim 24, wherein said substrate is an insulating transparent substrate, and said semiconductor film is a semiconductor selected from the group consisting of amorphous silicon, polycrystalline silicon, and microcrystalline silicon.

28. The method according to claim 24, wherein said insulator film is a passivation film of $SiO_2$ and/or $SiN_x$ containing no impurities serving as dopant, and said high-energy beam is a laser.

29. The method according to claim 24, wherein the said thickness of said insulator film is smaller than that of said semiconductor film and thickness of said insulator film is in the range from about 50 to 1000 Å.

30. The method according to claim 28, wherein said insulator film is a passivation film of $SiO_2$ and/or $SiN_x$ containing no impurities serving as dopant, and said high-energy beam is a laser.

31. A method of fabricating a semiconductor device, comprising the steps of:
forming a semiconductor film on a substrate;
providing an insulator film containing no impurities serving as dopant to cover said semiconductor film;
providing on said insulator film an impurity doped semiconductor film having large numbers of impurities for determining electrical conductivity doped therein;
irradiating a region of the device with a high-energy beam through said impurity doped semiconductor film to melt said insulator film, said semiconductor film, and said impurity doped semiconductor film in the irradiated region to form a polycrystalline electrical contact region having impurities supplied from the impurity doped semiconductor film doped therein; and
providing source and drain electrodes on said polycrystalline contact region, respectively, and providing a gate electrode on said insulator film.

32. The method according to claim 31, wherein said substrate is an insulating transparent substrate, and said semiconductor film is a semiconductor selected from the group consisting of amorphous silicon, polycrystalline silicon, and microcrystalline silicon.

33. The method according to claim 31, wherein the said thickness of said insulator film is smaller than that of said semiconductor film and thickness of said insulator film is in the range from about 50 to 1000 Å.

34. The method according to claim 31, wherein the thickness of said semiconductor film is 2000 Å, and the thickness of said insulator film is in the range from about 50 to 1000 Å.

* * * * *